United States Patent
Ying

(10) Patent No.: US 10,303,026 B2
(45) Date of Patent: May 28, 2019

(54) LIQUID CRYSTAL DISPLAYS AND THE PIXEL CIRCUIT STRUCTURE THEREOF

(71) Applicant: Shenzhen China Star Optoelectronics Technology Co., Ltd., Shenzhen, Guangdong (CN)

(72) Inventor: Jianjian Ying, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 54 days.

(21) Appl. No.: 15/510,666

(22) PCT Filed: Mar. 8, 2017

(86) PCT No.: PCT/CN2017/075929
§ 371 (c)(1),
(2) Date: Mar. 10, 2017

(87) PCT Pub. No.: WO2018/148995
PCT Pub. Date: Aug. 23, 2018

(65) Prior Publication Data
US 2018/0239207 A1    Aug. 23, 2018

(30) Foreign Application Priority Data
Feb. 17, 2017   (CN) .......................... 2017 1 0087322

(51) Int. Cl.
*G02F 1/1368*    (2006.01)
*G02F 1/1362*    (2006.01)
(Continued)

(52) U.S. Cl.
CPC ...... *G02F 1/136286* (2013.01); *G02F 1/1368* (2013.01); *G09G 3/364* (2013.01); *G09G 3/3659* (2013.01); *H01L 27/124* (2013.01); *G02F 1/136213* (2013.01); *G02F 2201/121* (2013.01); *G02F 2201/123* (2013.01);
(Continued)

(58) Field of Classification Search
CPC ................................................ G02F 1/136286
See application file for complete search history.

(56) References Cited

U.S. PATENT DOCUMENTS

2008/0297675 A1   12/2008 Kim
2009/0268112 A1   10/2009 Lu et al.
(Continued)

FOREIGN PATENT DOCUMENTS

CN         104036750 A      9/2014

*Primary Examiner* — Sang V Nguyen
(74) *Attorney, Agent, or Firm* — Andrew C. Cheng

(57) ABSTRACT

The present disclosure relates to a liquid crystal panel and the pixel circuit structure thereof. The pixel circuit structure includes at least one first scanning line, at least one second scanning line, and at least one data line. A source of the allocation electrode connects to the drain of the second pixel electrode, and a first discharging capacitor is arranged between the source and the first scanning line. With respect to the proposed pixel circuit structure, the wide viewing angle effect is not affected and the location of the first discharging capacitor is enhanced, i.e., the first discharging capacitor is arranged on the Gate. Thus, the first discharging capacitor has not occupied the aperture area, which greatly enhances the aperture rate and the transmission rate.

10 Claims, 4 Drawing Sheets

(51) Int. Cl.
  *H01L 27/12* (2006.01)
  *G09G 3/36* (2006.01)
(52) U.S. Cl.
  CPC ............ *G09G 2300/0426* (2013.01); *G09G 2300/0447* (2013.01); *G09G 2300/0465* (2013.01)

(56) References Cited

U.S. PATENT DOCUMENTS

| | | | |
|---|---|---|---|
| 2010/0231819 A1* | 9/2010 | Lee | G02F 1/1343 349/43 |
| 2011/0128460 A1* | 6/2011 | Cho | G02F 1/134363 349/41 |
| 2016/0093259 A1* | 3/2016 | Hsu | G09G 3/3607 345/690 |
| 2016/0171948 A1 | 6/2016 | Chen et al. | |
| 2016/0246125 A1* | 8/2016 | Wang | G02F 1/133345 |
| 2016/0246140 A1 | 8/2016 | Que | |
| 2017/0372663 A1* | 12/2017 | Wu | G09G 3/3233 |

\* cited by examiner

LIQUID CRYSTAL DISPLAYS AND THE PIXEL CIRCUIT STRUCTURE THEREOF

BACKGROUND OF THE INVENTION

1. Field of the Invention

The present disclosure relates to liquid crystal display technology, and more particularly to a liquid crystal display (LCD) and the pixel circuit structure thereof.

2. Discussion of the Related Art

The performance of the high resolution and high pixel per inch (PPI) is precise and fine so as to provide a high resolution display, which has been a main trend of display technology. The dimension of the pixels is also decreased when the resolution and the PPI are increased. With the decrease of the dimensional of the pixels, a ratio of a metal dimension to the unit dimension is increased, which resulting in that the corresponding aperture rate is decreased, and the corresponding transmission rate is decreased. Thus, the transmission rate is a key issue when designing the high resolution and high PPI pixels. Generally, vertical alignment (VA) mode has been designed with wide viewing angle compensation. i.e., which includes a discharging capacitor (Cdown). In current design, the discharging capacitor (Cdown) is arranged on the common electrode (Com). However, such design may sacrifice the aperture rate of the pixels, and thus the transmission rate of the products may be decreased.

SUMMARY

The present disclosure relates to a LCD and the pixel circuit structure thereof, which solves the issue of low transmission rate caused by the low aperture rate of the conventional LCD.

In one aspect, a pixel circuit structure having a high transmission rate includes: at least one first scanning line, at least one second scanning line, and at least one data line, wherein the first scanning line respectively connects to gates of a main pixel electrode and a second pixel electrode, the second scanning line connects to a gate of an allocation electrode, sources of the main pixel electrode and the second pixel electrode respectively connects to the data line, and drains of the main pixel electrode and the second pixel electrode respectively connects to an equivalent liquid crystal capacitor, a source of the allocation electrode connects to the drain of the second pixel electrode, and a first discharging capacitor is arranged between the source and the first scanning line.

In another aspect, a liquid crystal panel includes the above pixel circuit structure.

In view of the above, with respect to the proposed pixel circuit structure, the wide viewing angle effect is not affected and the location of the first discharging capacitor is enhanced, i.e., the first discharging capacitor is arranged on the Gate. Thus, the first discharging capacitor has not occupied the aperture area, which greatly enhances the aperture rate and the transmission rate. In addition, by configuring the second discharging capacitor between the drains of the main pixel electrode and the allocation electrode, the potential of the Main PE and the Sub PE are maintained to be different, such that the LCD operate normally.

BRIEF DESCRIPTION OF THE DRAWINGS

Embodiments of the invention will now be described more fully hereinafter with reference to the accompanying drawings, in which the technical advantages of the embodiments of the invention are shown.

DETAILED DESCRIPTION OF THE EMBODIMENTS

Embodiments of the invention will now be described more fully hereinafter with reference to the accompanying drawings, in which embodiments of the invention are shown.

First Embodiment

Figure 1:
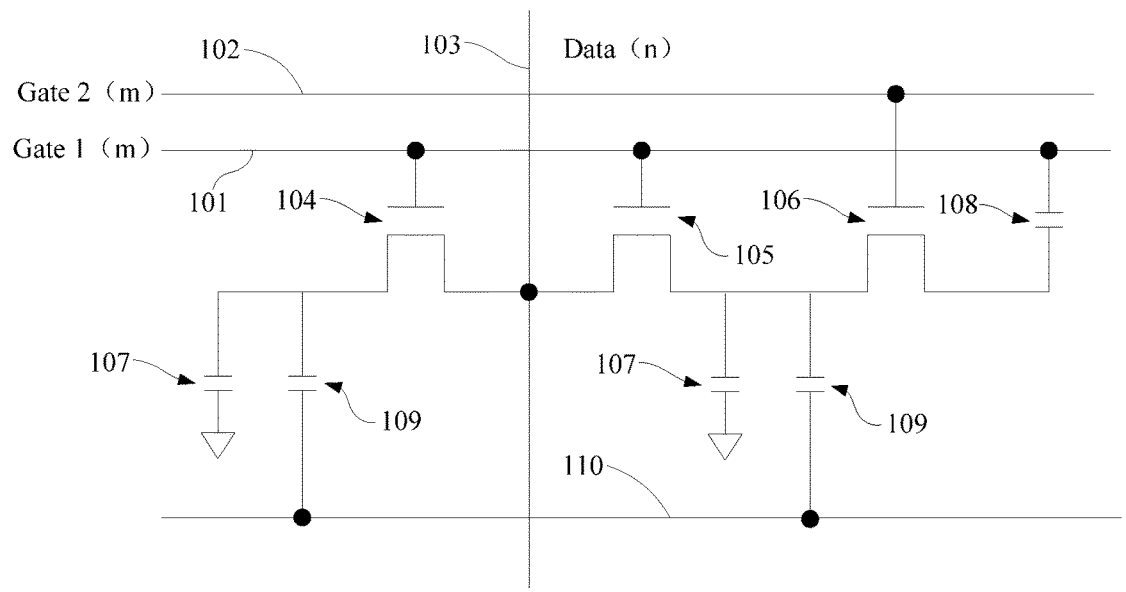
FIG. 1 is a circuit diagram of the pixel circuit structure having a high transmission rate in accordance with a first embodiment.
Figure 2:
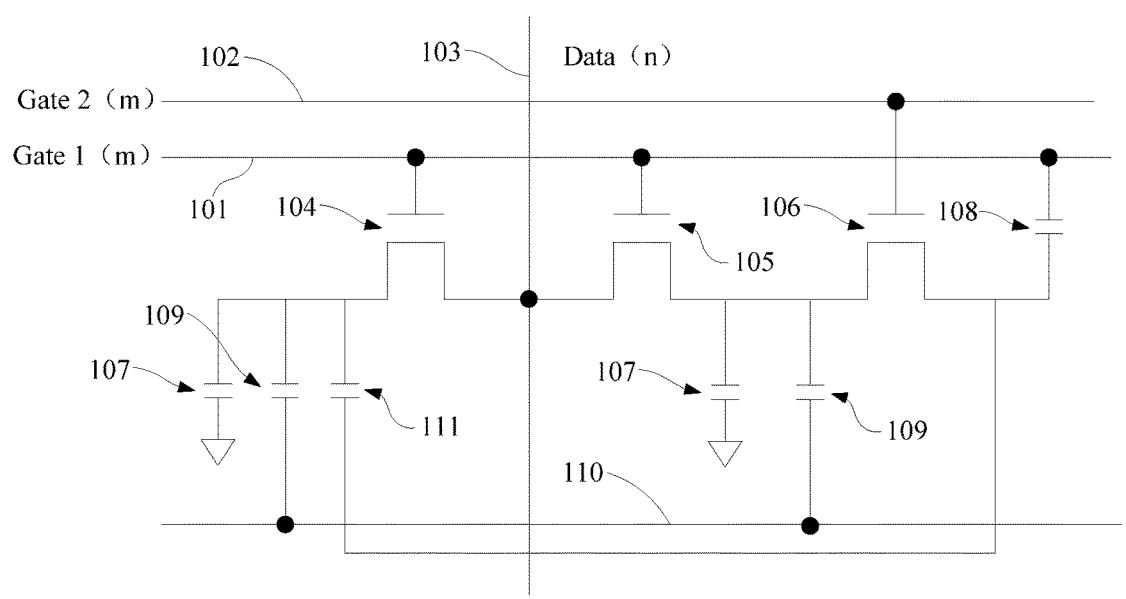
FIG. 2 is a layout diagram of the pixel circuit structure in accordance with the first embodiment.

FIG. 1 is a circuit diagram of the pixel circuit structure having a high transmission rate in accordance with a first embodiment. FIG. 2 is a layout diagram of the pixel circuit structure in accordance with the first embodiment. The pixel circuit structure includes at least one first scanning line 101, at least one second scanning line 102, and at least one data line 103.

Specifically, the first scanning line 101 respectively connects to gates of a main pixel electrode 104 and a second pixel electrode 105. The first scanning line 101 controls the main pixel electrode 104 (Main TFT) and the second pixel electrode 105 (second TFT or Sub TFT). The second scanning line 102 connects to a gate of an allocation electrode 106, and controls the transistor of the allocation electrode 106 (allocation TFT or Sharing TFT) to discharge to a pixel electrode (Sub PE).

The sources of the main pixel electrode 104 and the second pixel electrode 105 respectively connects to a data line 103, and the drains of the main pixel electrode 104 and the second pixel electrode 105 respectively connects to an equivalent liquid crystal capacitor 107.

The source of the transistor of the allocation electrode 106 connects to the drain of the transistor of the second pixel electrode 105, and a first discharging capacitor 108 is arranged between the source and the first scanning line 101. One end of the equivalent liquid crystal capacitor 107 respectively connects to the drains of the main pixel electrode 104 and the second pixel electrode 105, and the other end of the equivalent liquid crystal capacitor 107 connects to the common electrode of a color filter substrate (not shown).

The drains of the main pixel electrode 104 and the second pixel electrode 105 respectively connects to one end of a maintaining capacitor 109, and the other end of the maintaining capacitor 109 connects to the common electrode 110.

Preferably, the first discharging capacitor 108 and the allocation electrode 106 are respectively arranged on different scanning line 101 or 102. In other embodiments, the first discharging capacitor 108 and the allocation electrode 106 may be arranged on the same scanning line.

Preferably, the first discharging capacitor 108 is arranged on the first scanning line 101, and the allocation electrode 106 is arranged on the second scanning line 102. It is to be noted that the main configuration of the present disclosure is that first discharging capacitor 108 and the allocation electrode 106 are arranged on the scanning line. Persons in ordinary skilled are capable of conceiving that the first discharging capacitor 108 and the allocation electrode 106 are configured on which scanning line, and thus the corresponding configurations are omitted hereinafter.

One pixel corresponds to two Gate lines (scanning lines) 101, 102. The Pixel (m, n) corresponds to the Gate (m) and Data (n), and Gate1 (m) and Gate2 (m). Gate1 (m) controls the main pixel electrode 104 and the second pixel electrode 105, and Gate2 (m) controls the allocation electrode 106 (Sharing TFT). With respect to one frame of images, Gate2 (m) is turned on after the Gate1 (m) is turned on. Thus, when Gate1 (m) is turned on, Data line charges the second pixel electrode 105 (Sub) and the main pixel electrode 104 (Main PE) until the main pixel electrode 104 and the second pixel electrode 105 are fully charged. Afterward, the Gate1 (m) is turned off. At this moment, the potentials of the Sub and the Main PE are the same. When Gate2 (m) is turned on and the Sharing TFT is turned on, the Sub PE is discharged to the first discharging capacitor 108 (Cdown) so as to ensure that the potential of the Sub PE is lower than the Main PE. Thus, the viewing angle may be compensated.

As shown in FIG. 2, the Gate line are made by opaque metal material. The Sub and the Main PE are ITO transparent electrodes. With respect to conventional confirmation for wide viewing angle, the Cdown is configured on the common electrode (Com). If the dimension of the common electrode (Com) is increased, the aperture area of the pixels may be occupied. In view of the proposed pixel circuit structure, one end of the first discharging capacitor (Cdown) is arranged on the Gate2 (m), which does not occupy the dimension of the common electrode (Com). Thus, the aperture area of the pixels may be effectively increased so as to enhance the transmission rate.

Second Embodiment

Figure 3:
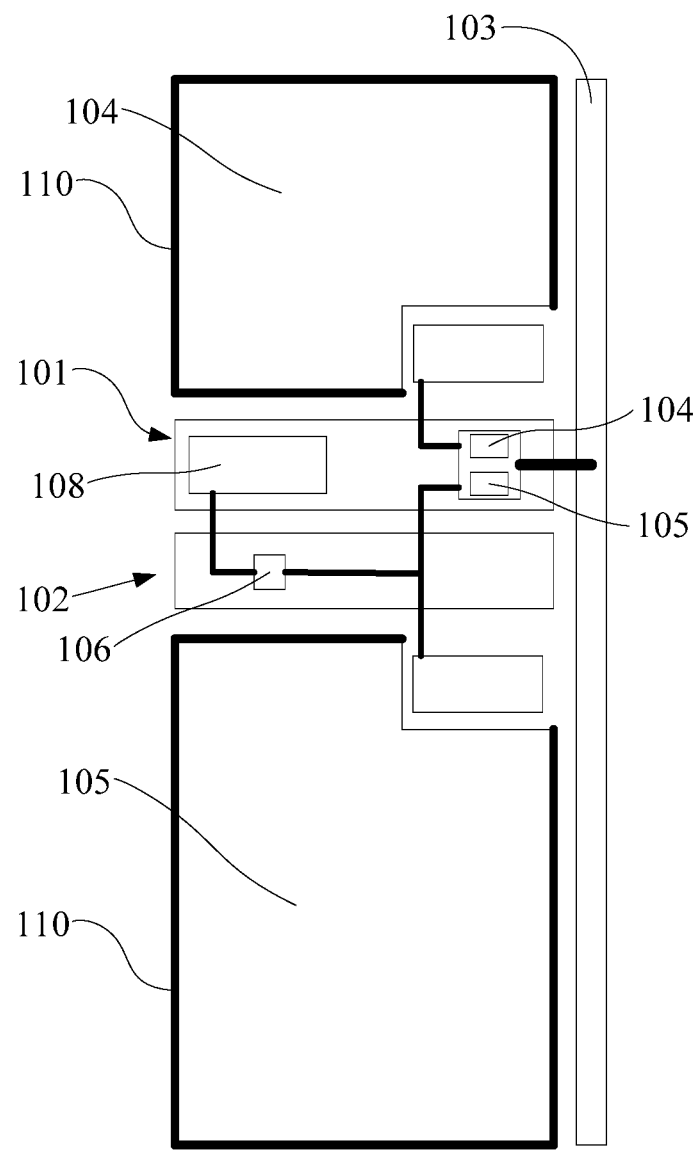
FIG. 3 is a circuit diagram of the pixel circuit structure having a high transmission rate in accordance with the second embodiment.
Figure 4:
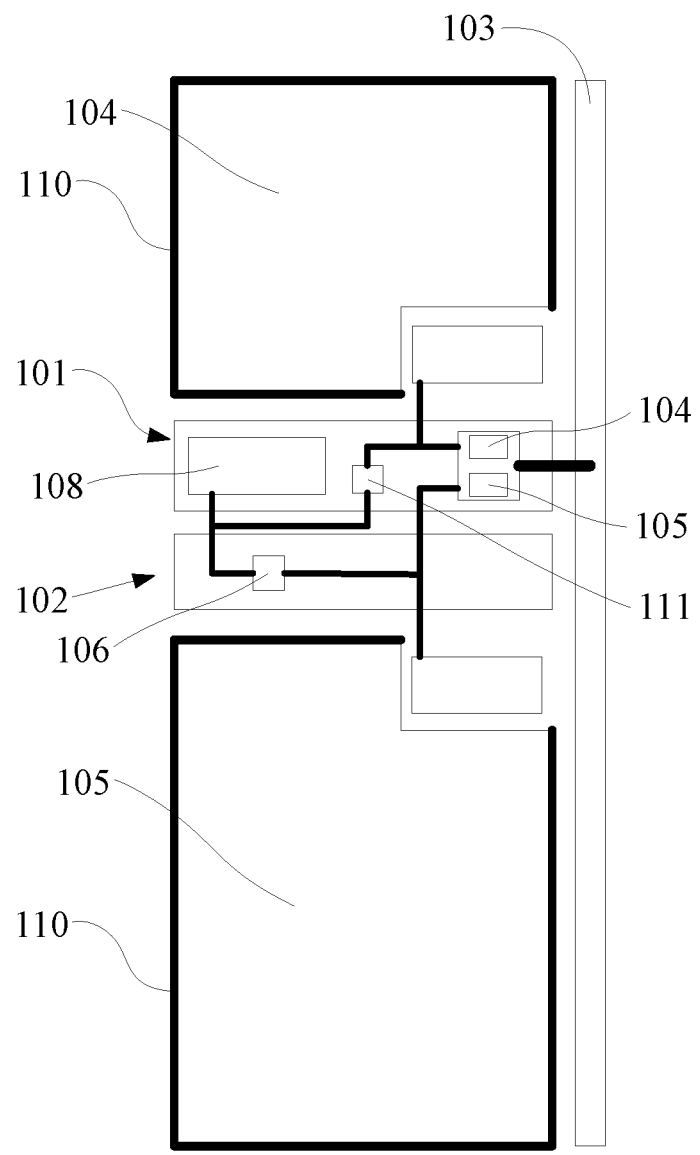
FIG. 4 is a layout diagram of the pixel circuit structure in accordance with the second embodiment.

FIG. 3 is a circuit diagram of the pixel circuit structure having a high transmission rate in accordance with the second embodiment. FIG. 4 is a layout diagram of the pixel circuit structure in accordance with the second embodiment. The pixel circuit structure includes at least one first scanning line 101, at least one second scanning line 102, and at least one data line 103.

Specifically, the first scanning line 101 respectively connects to the gates of a main pixel electrode 104 and a second pixel electrode 105. The first scanning line 101 controls the main pixel electrode 104 (Main) and the second pixel electrode 105 (Sub TFT). The second scanning line 102 connects to a gate of an allocation electrode 106, and controls the transistor of the allocation electrode 106 (Sharing TFT) to discharge to a pixel electrode (Sub PE).

The sources of the main pixel electrode 104 and the second pixel electrode 105 respectively connects to a data line 103, and the drains of the main pixel electrode 104 and the second pixel electrode 105 respectively connects to an equivalent liquid crystal capacitor 107.

The source of the transistor of the allocation electrode 106 connects to the drain of the transistor of the second pixel electrode 105, and a first discharging capacitor 108 is arranged between the source and the first scanning line 101. One end of the equivalent liquid crystal capacitor 107 respectively connects to the drains of the main pixel electrode 104 and the second pixel electrode 105, and the other end of the equivalent liquid crystal capacitor 107 connects to the common electrode of a color filter substrate (not shown).

The drains of the main pixel electrode 104 and the second pixel electrode 105 respectively connects to one end of a maintaining capacitor 109, and the other end of the maintaining capacitor 109 connects to the common electrode 110.

Preferably, the first discharging capacitor 108 and the allocation electrode 106 are respectively arranged on different scanning line 101 or 102. In other embodiments, the first discharging capacitor 108 and the allocation electrode 106 may be arranged on the same scanning line.

Preferably, the first discharging capacitor 108 is arranged on the first scanning line 101, and the allocation electrode 106 is arranged on the second scanning line 102. It is to be noted that the main configuration of the present disclosure is that first discharging capacitor 108 and the allocation electrode 106 are arranged on the scanning line. Persons in ordinary skilled are capable of conceiving that the first discharging capacitor 108 and the allocation electrode 106 are configured on which scanning line, and thus the corresponding configurations are omitted hereinafter.

The difference between the second embodiment and the first embodiment resides in that the pixel circuit structure also includes a second discharging capacitor 111 configured between the drains of the main pixel electrode 104 and the allocation electrode 106. When the potential of the second pixel electrode 105 (Sub PE) is changed, the potential of the Main PE and the Sub PE are maintained to be different from one other due to the second discharging capacitor 111.

Preferably, the second discharging capacitor 111 may arranged on the first scanning line 101 or the on the second scanning line 102. In the embodiment, the second discharging capacitor 111 is arranged on the first scanning line 101. In other embodiment, the second discharging capacitor 111 is arranged on the second scanning line 102.

Figure 5:
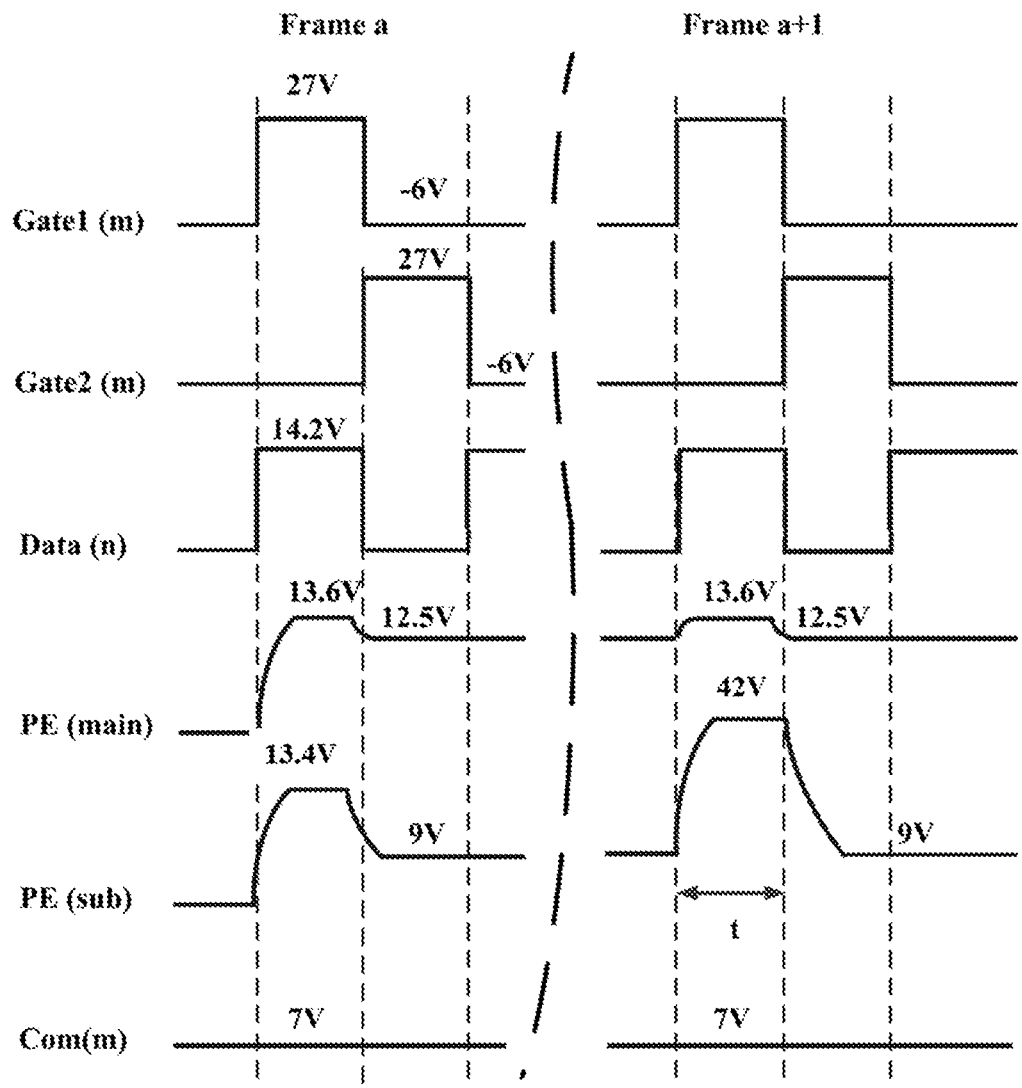
FIG. 5 is a circuit control wave diagram of the pixel circuit structure in accordance with one embodiment.

FIG. 5 is a circuit control wave diagram of the pixel circuit structure in accordance with one embodiment. In an example, the circuit operating on 60 Hz is configured with the resolution of 1920*1080 (FHD), wherein the Gate turn-on voltages are respectively 27V and −6V. The positive polarity of the data signals of 255 grayscale is 14.2 V, the potential of the Com is 7V, the negative polarity of the data signals of the 255 grayscale may be configured in accordance with real scenarios. That is, the potential of the negative polarity and the Com may be configured in accordance with real scenarios to ensure the symmetry of the positive and the negative frames. Within one frame, the turn-on time period of the Gate is 14.8 us, (1 s/60/1080=15.4 us, and resulting in 14.8 us after the blinking time is deducted), as shown in FIG. 5.

One pixel corresponds to two Gate lines (scanning lines). The Pixel (m, n) corresponds to the Gate (m) and Data (n), and Gate1 (m) and Gate2 (m). Gate1 (m) controls the main pixel electrode 104 and the second pixel electrode 105, and Gate2 (m) controls the allocation electrode 106 (Sharing TFT). With respect to one frame of images, Gate2 (m) is turned on after the Gate1 (m) is turned on. Thus, when Gate1 (m) is turned on, Data (14.2V) charges the second pixel electrode 105 (Sub) and the main pixel electrode 104 (Main PE). If the charging rate is 96%, the potentials of the Main and the Sub PE are respectively 13.6V and 13.4V, which are different due to different TFT parameters. Gate1 (m) is turned off after being turned on for 14.8 us. When Gate2 (m)

is turned on, the Sharing TFT is turned on to discharge the Sub PE to the first discharging capacitor 108 (Cdown). After the Cdown is full, the Sub PE maintains the voltage of 9V. In an example, Vsub/Vmain=72%, and the parameter may be configured in accordance with the Cdown so as to compensate the viewing angle.

When the Gate1 (m) of the next frame is turned on, the potential of one end of the Cdown, i.e., the potential of Gate1 (m) transits from −6V to 27V, and ΔV=33V and Sub PE is reduced to 9V. The potential 42V of the Sub PE is maintained for 14.8 us. The deflection time of the liquid crystal is in ms scale, and the capacitive coupling effect does not affect the deflection of the liquid crystal, and the thus the LCD may operate normally.

In view of the above, with respect to the proposed pixel circuit structure, the wide viewing angle effect is not affected and the location of the first discharging capacitor is enhanced, i.e., the first discharging capacitor is arranged on the Gate. Thus, the first discharging capacitor has not occupied the aperture area, which greatly enhances the aperture rate and the transmission rate. In addition, by configuring the second discharging capacitor between the drains of the main pixel electrode and the allocation electrode, the potential of the Main PE and the Sub PE are maintained to be different, such that the LCD operate normally.

Further, a liquid crystal panel is including a liquid crystal panel, a backlight plate, and the above pixel circuit structure is disclosed, wherein the detailed descriptions of the pixel circuit structure may be referenced in the above, and the other components of the liquid crystal panel may be conceived by persons skilled in the art, and thus are omitted hereinafter.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A pixel circuit structure having a high transmission rate, comprising:
at least one first scanning line, at least one second scanning line, and at least one data line, wherein the width of the first scanning line is the same throughout, and the first scanning line respectively connects to gates of a main TFT and a second TFT, the second scanning line connects to a gate of an allocation TFT, sources of the main TFT and the second TFT respectively connects to the data line, and drains of the main TFT and the second TFT respectively connects to an equivalent liquid crystal capacitor, a source of the allocation TFT connects to the drain of the second TFT, and a first discharging capacitor is arranged between the drain of the allocation TFT and the first scanning line, wherein the first discharging capacitor formed with two electrode members are overlapped with each other is arranged on the first scanning line, and the width of the first discharging capacitor is less than the width of the first scanning line, a second discharging capacitor configured between the drains of the main TFT and the allocation TFT is connected to the first discharging capacitor, and the first discharging capacitor and the allocation TFT are respectively arranged on different scanning lines.

2. A pixel circuit structure having a high transmission rate, comprising:
at least one first scanning line, at least one second scanning line, and at least one data line, wherein the width of the first scanning line is the same throughout, and the first scanning line respectively connects to gates of a main TFT and a second TFT, the second scanning line connects to a gate of an allocation TFT, sources of the main TFT and the second TFT respectively connects to the data line, and drains of the main TFT and the second TFT respectively connects to an equivalent liquid crystal capacitor, a source of the allocation TFT connects to the drain of the second TFT, and a first discharging capacitor is arranged between the source drain of the allocation TFT and the first scanning line, wherein the first discharging capacitor formed with two electrode members are overlapped with each other is arranged on the first scanning line, a second discharging capacitor configured between the drains of the main TFT and the allocation TFT is connected to the first discharging capacitor, the first discharging capacitor and the allocation TFT are respectively arranged on different scanning lines, and the width of the first discharging capacitor is less than the width of the first scanning line.

3. The pixel circuit structure as claimed in claim 2, wherein the first discharging capacitor and the allocation TFT are respectively arranged on different scanning lines.

4. The pixel circuit structure as claimed in claim 3, wherein the allocation TFT is arranged on the second scanning line.

5. The pixel circuit structure as claimed in claim 2, wherein the second discharging capacitor is arranged on the first scanning line or the second scanning line.

6. The pixel circuit structure as claimed in claim 5, wherein the second discharging capacitor is arranged on the first scanning line.

7. The pixel circuit structure as claimed in claim 2, wherein one end of the equivalent liquid crystal capacitor respectively connects to the drains of the main TFT and the second TFT, and the other end of the equivalent liquid crystal capacitor connects to the common electrode of a color filter substrate.

8. The pixel circuit structure as claimed in claim 2, wherein the drains of the main TFT and the second TFT respectively connects to one end of a maintaining capacitor, and the other end of the maintaining capacitor connects to the common electrode.

9. A liquid crystal panel, comprising:
a pixel circuit structure having a high transmission rate, the pixel circuit structure comprises:
at least one first scanning line, at least one second scanning line, and at least one data line, wherein the first scanning line respectively connects to gates of a main TFT and a second TFT, the second scanning line connects to a gate of an allocation TFT, sources of the main TFT and the second TFT respectively connects to the data line, and drains of the main TFT and the second TFT respectively connects to an equivalent liquid crystal capacitor, a source of the allocation TFT connects to the drain of the second TFT, and a first discharging capacitor is arranged between the drain of the allocation TFT and the first scanning line, wherein the first discharging capacitor formed with two electrode members are overlapped with each other is arranged on the first scanning line, and the width of the first discharging capacitor is less than the width of the first scanning line;

wherein a second discharging capacitor configured between the drains of the main TFT and the allocation TFT is connected to the first discharging capacitor; and wherein the second discharging capacitor is arranged on the first scanning line or the second scanning line.

10. The liquid crystal panel as claimed in claim 9, wherein the second discharging capacitor is arranged on the first scanning line.

\* \* \* \* \*